(12) United States Patent
Guan et al.

(10) Patent No.: US 6,873,449 B1
(45) Date of Patent: Mar. 29, 2005

(54) SIGNAL TRANSMISSION LINE FOR AN OPTICAL MODULATOR

(75) Inventors: Lim Cheng Guan, Tokyo (JP); Sonomi Ishii, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 4 days.

(21) Appl. No.: 10/654,945

(22) Filed: Sep. 5, 2003

(51) Int. Cl.[7] .............. G02B 6/42; H01S 3/18
(52) U.S. Cl. ..................... 359/245; 354/248
(58) Field of Search ................ 359/248, 245, 359/237, 238; 385/14, 2; 372/26, 38.1, 38.01, 38.05; 369/181, 198

(56) References Cited

U.S. PATENT DOCUMENTS 5,602,672 A * 2/1997 Ishimura et al. ............ 359/245
5,781,578 A * 7/1998 Takagi ........................ 372/50
6,057,954 A * 5/2000 Parayanthal et al. ........ 359/248

FOREIGN PATENT DOCUMENTS

JP        9-252164        9/1997

* cited by examiner

Primary Examiner—Scott J. Sugarman
Assistant Examiner—Richard Hanig
(74) Attorney, Agent, or Firm—Oblon, Spivak, McClelland, Maier & Neustadt, P.C.

(57) ABSTRACT

An electro-absorptive-modulated laser (EAML) module includes a signal transmission line for transferring a high-frequency modulating signal from a signal source having an output impedance of 50 Ω to an EA modulator in the EAML module. The signal transmission line includes a coplanar waveguide with ground plane (CPWG) having a characteristic impedance of 41.8 Ω, a series resistor having a resistance of 5 Ω, and a termination resistor of 50 to 150 Ω. The characteristic impedance of CPWG is controlled by reducing the gap between the signal line and coplanar ground plates.

9 Claims, 13 Drawing Sheets

PRIOR ART

EXAMPLE 1

EXAMPLE 2

EXAMPLE 3

PRIOR ART

EXAMPLES

SIGNAL TRANSMISSION LINE FOR AN OPTICAL MODULATOR

BACKGROUND OF THE INVENTION (a) Field of the Invention

The present invention relates to a signal transmission line for an optical modulator and, more particularly, to the improvement of the signal transmission line for transmitting a high-frequency modulating signal to the optical such as an electro-absorptive modulator (EA modulator) suitably used in an electro-absorptive-modulated laser (EAML) module.

(b) Description of the Related Art

The EAML module has an integrated optical device including a distributed-feedback (DFB) laser diode and an associated EA modulator, which are integrated on a common semiconductor substrate. The EAML modules now attract increasing attention for use in an optical communication system due to the smaller occupied area and the lower fabrication cost thereof.

Figure 17:
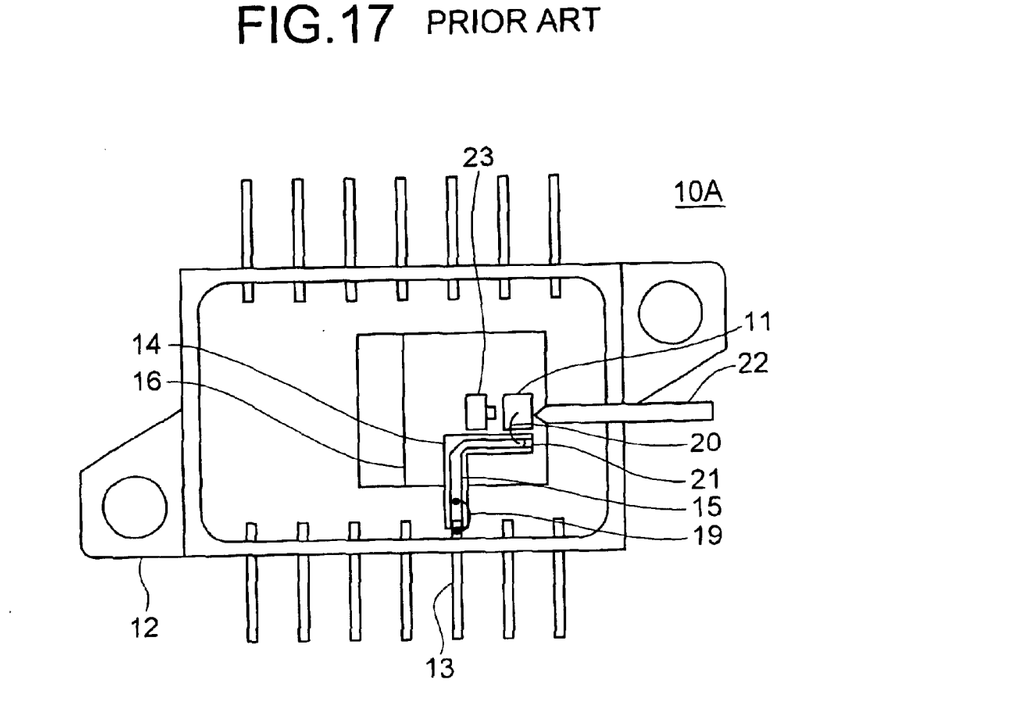
FIG. 17 is a top plan view of a conventional EAML module.

FIG. 17 shows a conventional EAML module described in Patent Publication JP-A-9(1997)-252164. The EAML module 10A includes a chip of an integrated optical device 11 encapsulated in an air-tight package 12 having thereon a plurality of external pins 13. A high-frequency modulating signal input through one of the external pins 13 is transferred through a signal transmission line (assembly) 14 to the EA modulator in the integrated optical device 11. The signal transmission line 14 includes a micro-strip line 15 and an aluminum nitride carrier mounting thereon the micro-strip line 15, the aluminum nitride carrier being mounted on a chip carrier 16 mounting thereon the integrated optical device 11 together with the signal transmission line 14.

The micro-strip line 15 is connected to the external pin 13 via a bonding wire 19, and also connected to the EA modulator in the integrated optical device 11 via a bonding wire 20. A termination resistor 21 is connected to the end of the micro-strip line. The optical output of the integrated optical device 11 is coupled to an optical fiber 22 for transferring the modulated optical signal. A photodiode 23 is optically coupled to the rear end of the DFB laser diode in the integrated optical device 11 for measuring the level of the optical output power from the laser diode.

Figure 18:
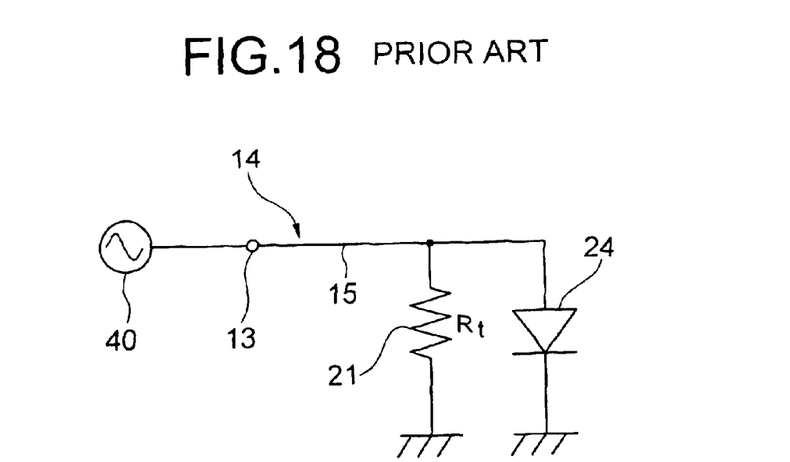
FIG. 18 is an equivalent circuit diagram of the EAML module of FIG. 17.

FIG. 18 shows the equivalent circuit diagram of the signal transmission line 14 transferring the high-frequency modulating signal from the signal source to the EA modulator. The output impedance of the signal source 40 is designed at 50 Ω, the micro-strip line 15 has a characteristic impedance of 50 Ω, and the EA modulator 24 is substantially equivalent to a capacitor having a capacitance of 0.7 pF, for example. The termination resistor 21 has a resistance Rt of 50 Ω.

In operation, the combination impedance of the EA modulator 24 and the termination resistor 21 has a resistance of around 50 Ω in a lower frequency range, which matches with the output impedance (50 Ω) of the signal source 40. On the other hand, in a higher frequency range around 10 GHz or above, the combination impedance significantly reduces below 50 Ω due to the reduction in the impedance of the EA modulator 24 having a capacitive impedance. The reduction of the combination impedance causes impedance mismatching of the overall input impedance of the EA modulator 24 including the signal transmission line 14 with the output impedance (50 Ω) of the signal source 40.

The signal reflection is generally evaluated by the term "input return loss" which is defined by a ratio (dB) of the signal power returned from the EAML module 10A toward the signal source 40 to the total signal power supplied from the signal source 40. The input return loss decreases the efficiency of the signal conversion from the input electric signal to the output optical signal in the EA modulator, and thus it is desired to reduce the input return loss at the desired frequency range. It is prescribed in the industrial RF specifications of the optical communication system that the input return loss be −10 dB or lower at the operating frequency thereof. This should be achieved together with a specified (−3 dB) modulation bandwidth of around 10 GHz or above, for example.

In a high-frequency range, the maximum power transfer cannot be achieved unless the overall impedance of the load, i.e., EA modulator 24 including the signal transmission line 14, is a conjugate of the source impedance. Thus, the impedance matching is attempted in the conventional technique; however, it is difficult in fact to achieve the impedance matching in the desired frequency range of the EA modulator, or optical modulator in general.

SUMMARY OF THE INVENTION

In view of the above problem in the conventional technique, it is an object of the present invention to provide a signal transmission line for use in an optical modulator, which is capable of achieving an input return loss of −10 dB or lower at a desired frequency range, e.g., at 10 GHz or above.

It is another object of the present invention to provide a EA modulator having such a signal transmission line.

In one aspect, the present invention provides a signal transmission line for transferring a modulating signal from a signal source having an output impedance of 50 Ω to an electro-absorptive modulator, the signal transmission line including: a signal line and at least one associated ground line, the signal line having a characteristic impedance of 35 to 47 Ω, preferably 37 to 45 Ω; a series resistor having a resistance of 10 Ω or below; and a termination resistor having a resistance of 50 to 150 Ω.

In accordance with the signal transmission line of the present invention, the specified values for the characteristic impedance of the signal line, resistance of the series resistor and the resistance of the termination resistor achieve superior impedance matching of the EA modulator with the signal source having an output impedance of 50 Ω at a desired frequency range, to thereby reduce the input return loss substantially without degrading the modulation response at around 10 GHz or lower. For a more general case, wherein the signal source has an output impedance of R1, the signal line of the present invention may have a characteristic impedance of 0.7R1 to 0.94R1, and a termination resistor having a resistance of R1 to 3 R1.

It is to be noted that "zero ohm" of the series resistor in the present invention means that the use of the series resistor itself may be obviated.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings, wherein similar constituent elements are designated by similar reference numerals throughout the drawings.

Figure 1:
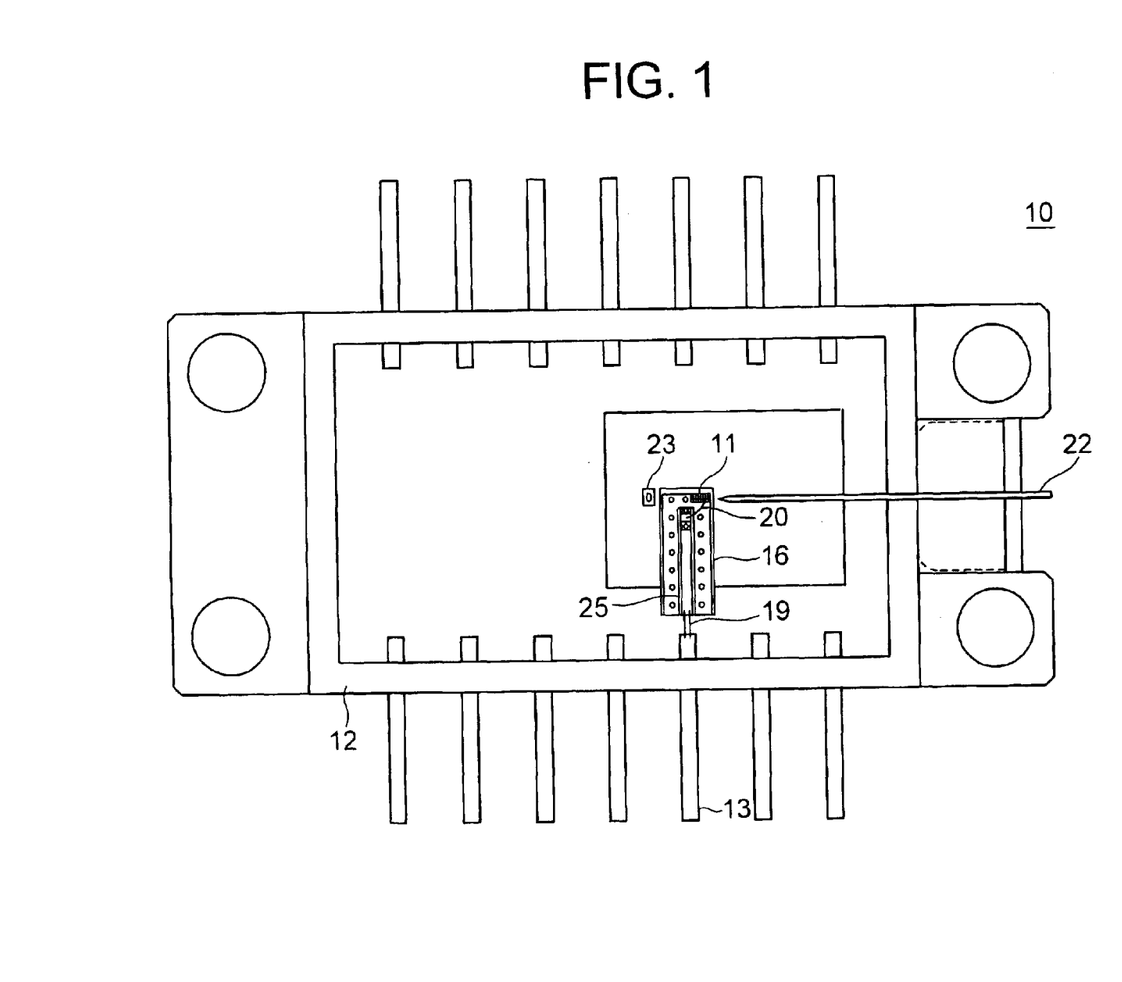
FIG. 1 is a top plan view of an EAML module including an EA modulator according to a first embodiment of the present invention.

Referring to FIG. 1, an EAML module, generally designated by numeral 10, includes an EA modulator according to an embodiment of the present invention. The EAML module of FIG. 1 is similar to the conventional EAML module 10A of FIG. 17 except for the configuration of the signal transmission line 25, which is implemented in the present embodiment by a coplanar waveguide with ground plane (CPWG) for transmission of a modulating signal between the external pin 13 and the EA modulator installed in an integrated optical device 11 formed as an EAML chip.

More specifically, the EAML module 10 includes the EAML chip implementing the integrated optical device 11 and encapsulated in an air-tight package 12 having thereon a plurality of external pins 13. The high-frequency modulating signal input through one of the external pins 13 is transmitted through the signal transmission line 25 to the EA modulator in the integrated optical device 11. The signal transmission line 25 is mounted on a chip carrier 16 mounting thereon the integrated optical device 11 together with the signal transmission line 25.

The input side of the signal transmission line 25 is connected to one of the signal pins 13 via a bonding wire 19, and the output side of the signal transmission line 25 is connected to the EA modulator in the integrated optical device 11 via a bonding wire 20. The optical output of the integrated optical device 11 is coupled to an optical fiber 22 for transferring the modulated laser. A photodiode 23 is optically coupled to the rear end of the DFB laser diode in the integrated optical device 11 for measuring the level of the optical output power from the DFB laser diode.

Figure 2:
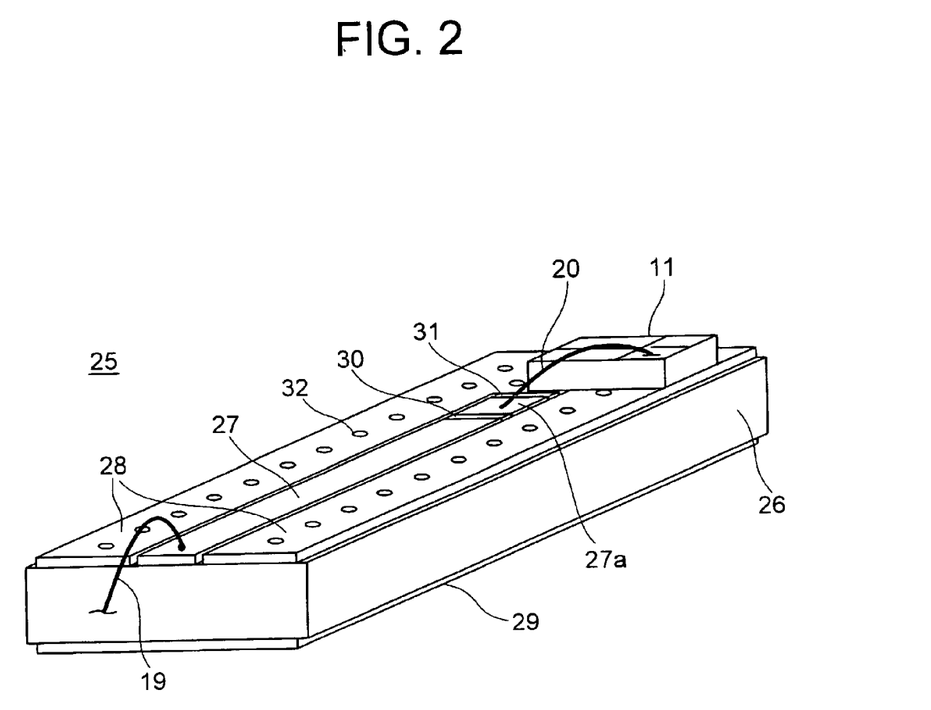
FIG. 2 is a schematic perspective view of the signal transmission line shown in FIG. 1.

Referring to FIG. 2, there is shown the structure of the signal transmission line 25 and the EAML chip 11 shown in FIG. 1. The signal transmission line 25 includes an aluminum nitride carrier 26, and a CPWG formed thereon. The CPWG includes a coplanar waveguide formed on top of the aluminum nitride carrier 26 and including a signal line 27 and a pair of coplanar ground planes 28 extending parallel to the signal line 27 for sandwiching therebetween the signal line 27, and a bottom ground plate 29 formed on the bottom surface of the aluminum nitride carrier 26.

A series resistor 30 is interposed between a first portion and a second portion of the signal line 27, the second portion constituting an electrode pad. A termination resistor 31 is formed on the distal end of the second portion of the signal line 27. The second portion of the signal line 27 is connected to the EA modulator in the EAML chip 11 via a bonding wire 20. The coplanar ground plates 28 and the bottom ground plate 29 are connected together through a plurality of via-plugs 32. The thickness of the aluminum nitride carrier 26 is 0.9 mm, for example.

The termination resistor 31 has a resistance of 80 Ω±5%, whereas the series resistance 30 has a resistance of 5 Ω±5%. The signal line 27 is 3.2 mm long in the first portion, 0.2 mm long in the second portion, 0.3 mm wide and 2 μm thick in both the first and second portions. The gap between the signal line 27 and each coplanar ground line 28 is 0.06 mm±0.01 mm, whereby the signal line 27 has a characteristic impedance of 41.8 Ω±1.9 Ω, which is well lower than the usual characteristic impedance (50 Ω) matched with the output impedance of the signal source. The combination of the series resistance 30 and the termination resistance 31 ensures that 94% of the input voltage is applied across the EA modulator.

The signal transmission line 25 for the EA modulator in the present embodiment is evaluated by simulation while comparing the same with a conventional signal transmission line.

Figure 3:
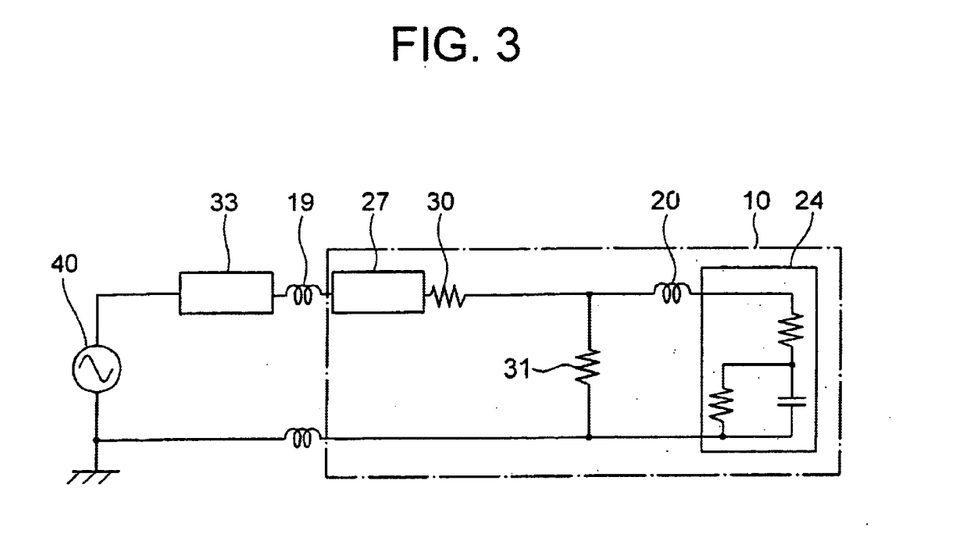
FIG. 3 is an equivalent circuit diagram of the EA modulator in the EAML module of FIG. 1.

FIG. 3 shows an equivalent circuit diagram of the signal transmission line for the EA modulator in the EAML module 10. The signal source 40 has an output impedance of 50 Ω, an external transmission line 33 has a characteristic impedance of 50 Ω, the signal line 27 has a characteristic impedance of 41.8 Ω, series resistor 30 has a resistance of 5 Ω, termination resistor 31 has a resistance of 80 Ω, bonding wires 19 and 20 have inductances of 0.3 nH and 0.4 nH, respectively, and the EA modulator 24 has a series resistance of 5 Ω, a parallel resistance of 90 Ω and a capacitance of 0.4 pF in this example.

Figure 4:
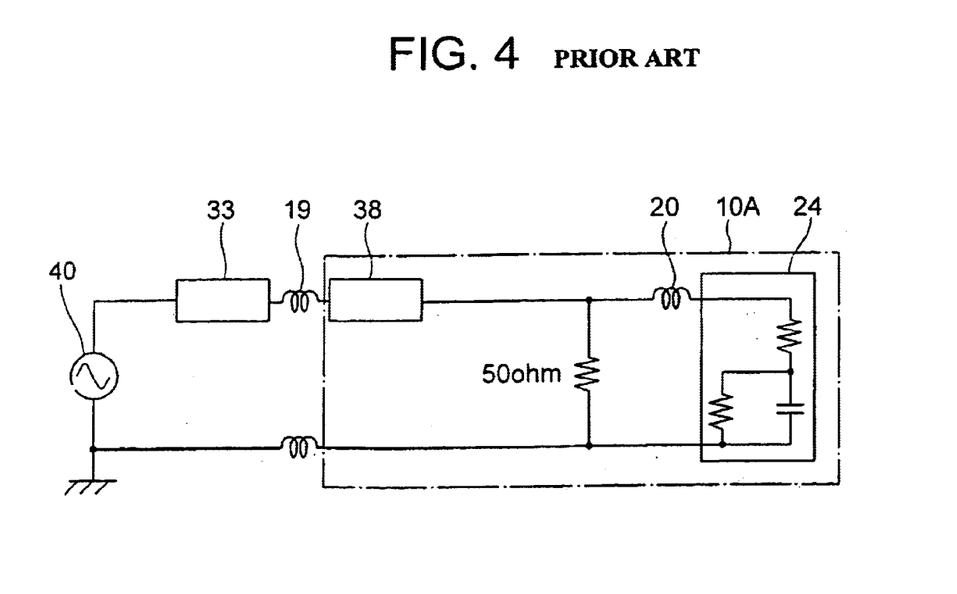
FIG. 4 is an equivalent circuit diagram of a comparative example representing a conventional EA modulator.

FIG. 4 shows an equivalent circuit diagram of the signal transmission for an EA modulator in the conventional EAML module 10A. The signal line 38 in the conventional EAML module 10A includes a transmission line 33 which is 3.4 mm long, 0.3 mm wide and 0.2 μm thick, and has a gap of 0.12 mm between the signal line and the coplanar ground plate, whereby the signal line 38 has a characteristic impedance of 50 Ω. Other configurations are similar to those of the EAML module 10A shown in FIG. 3.

Figure 5A:
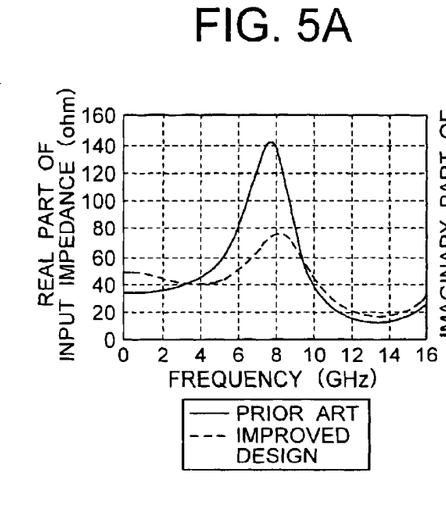
FIGS. 5A and 5B are graphs showing frequency dependencies of the real part and imaginary part, respectively, of the impedances of the EA modulators of the first embodiment and the comparative example.
Figure 5B:
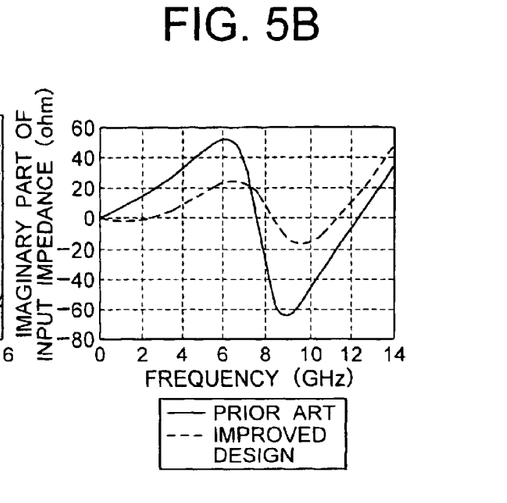

Referring to FIGS. 5A and 5B, there are shown frequency dependencies of the real part and the imaginary part, respectively, of the input impedances of the EAML modules shown in FIGS. 3 and 4. The real part of the input impedance for the frequencies below 10 GHz in the EAML module 10 of the present embodiment ranges from around 40 Ω to around 80 Ω, which is significantly improved from the range between around 30 Ω and 140 Ω of the conventional EAML module 10A. Similarly, the imaginary part of the input impedance for the frequencies below 10 GHz in the EAML module 10 of the present embodiment ranges from around j25 to −j17, which is significantly improved from the range between around j53 Ω and −j64 Ω of the conventional EAML module 10A.

Figure 6A:
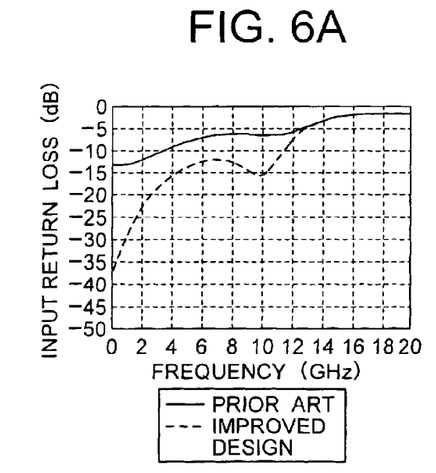
FIGS. 6A and 6B are graphs showing frequency dependencies of the input return loss and modulation response, respectively, of the EA modulators of the first embodiment and the comparative example.
Figure 6B:
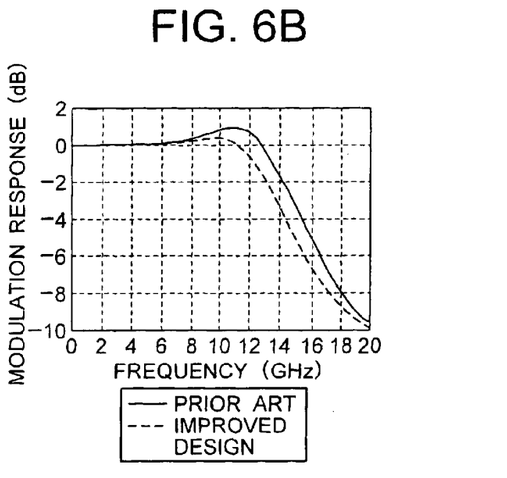

Referring to FIGS. 6A and 6B, there are shown frequency dependencies of the input return loss and the modulation response, respectively, of the EAML modules shown in FIGS. 3 and 4. The modulation response is defined by the ratio (dB) of the output optical signal power to the input electric signal power. As understood from FIG. 6A, due to the improvement in the frequency dependency of the input impedance, the input return loss of the EAML module 10 of the present embodiment resides below −20 dB at a frequency of around 3 GHz, for example, which is significantly improved from the input return loss of −10 dB at the same frequency in the conventional EAML module 10A. Reduction of the input return loss is achieved up to a frequency of 12 GHz.

As shown in the modulation response of FIG. 6B, the −3 dB modulation bandwidth of the present embodiment is around 14 GHz, which is slightly inferior to the −3 dB modulation bandwidth of the conventional EAML module residing at around 15 GHz. This slight degradation can be accepted in view of the above significant improvement in the input return loss, for which the conventional EAML module does not meet the requirement in the specifications for the optical communication.

Figure 7:
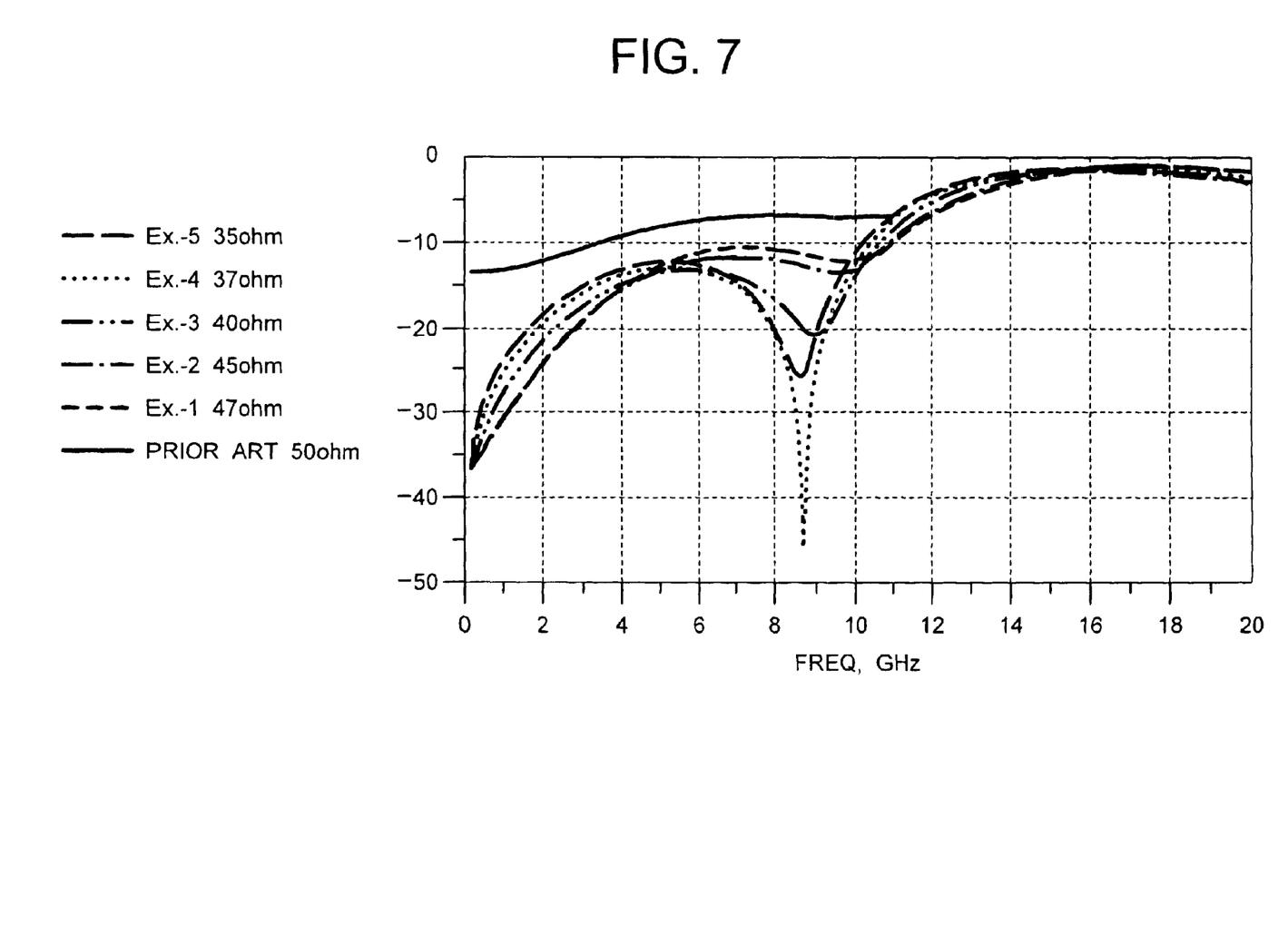
FIG. 7 is a graph showing the frequency dependency of the input return loss for different characteristic impedances, with the series resistance being fixed at 5 Ω.
Figure 8A:
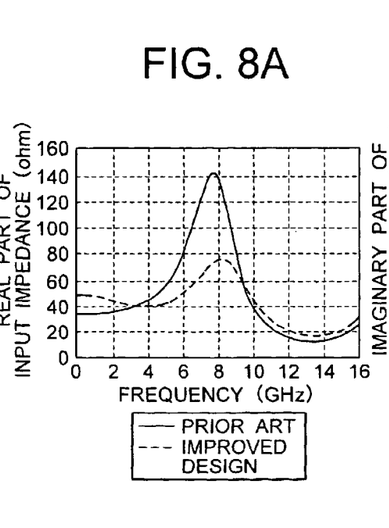
FIGS. 8A and 8B are graphs showing frequency dependencies of the real part and imaginary part, respectively, of the impedances of EA modulators according to a second embodiment and a comparative example representing a corresponding conventional EA modulator.
Figure 8B:
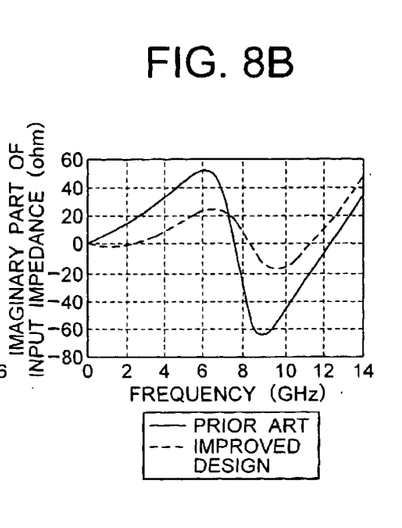
Figure 9A:
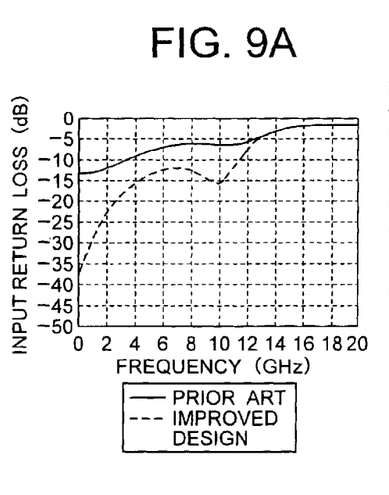
FIGS. 9A and 9B are graphs showing frequency dependencies of the input return loss and modulation response, respectively, of the EA modulators of the second embodiment and the corresponding comparative example.
Figure 9B:
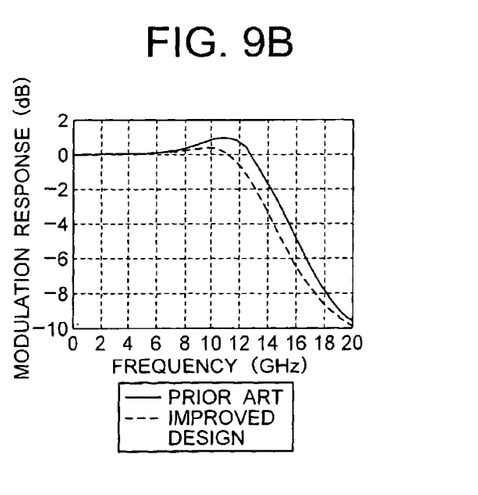

FIG. 7 shows the frequency dependency of the input return loss of the EA modulator according to the first embodiment for different values of the characteristic impedance of the CPWG signal line, with the series resistance and the termination resistance being fixed at 5 Ω and 80 Ω, respectively. In this example, the characteristic impedance were selected at 50 Ω (conventional), 47 Ω, 45 Ω, 40 Ω, 37 Ω, 35 Ω (embodiment). The conventional EA modulator had a characteristic impedance of 50 Ω in the signal transmission line, a termination resistance of 50 Ω and no series resistance. In FIG. 7, the embodiments had significant improvements in the input return loss at frequencies between around 6 GHz and 10 GHz.

An EA modulator according to a second embodiment of the present invention is similar to the first embodiment except for the configuration of the signal transmission line, which is implemented by a coplanar waveguide having no bottom ground plane (CPW).

The improvements in the frequency dependencies of the real part, imaginary part of the input impedance and the input return loss as well as the modulation response are similar to those in the first embodiment, as illustrated in FIGS. 8A, 8B, 9A and 9B showing the real part of the input impedance, imaginary part of the input impedance, input return loss and the modulation response, respectively, of the EA modulator of the second embodiment and a corresponding comparative example. The corresponding comparative example is similar to the conventional EA modulator shown in FIG. 4 except for the signal transmission line therefor, which is implemented by a CPW in this comparative example.

Figure 10:
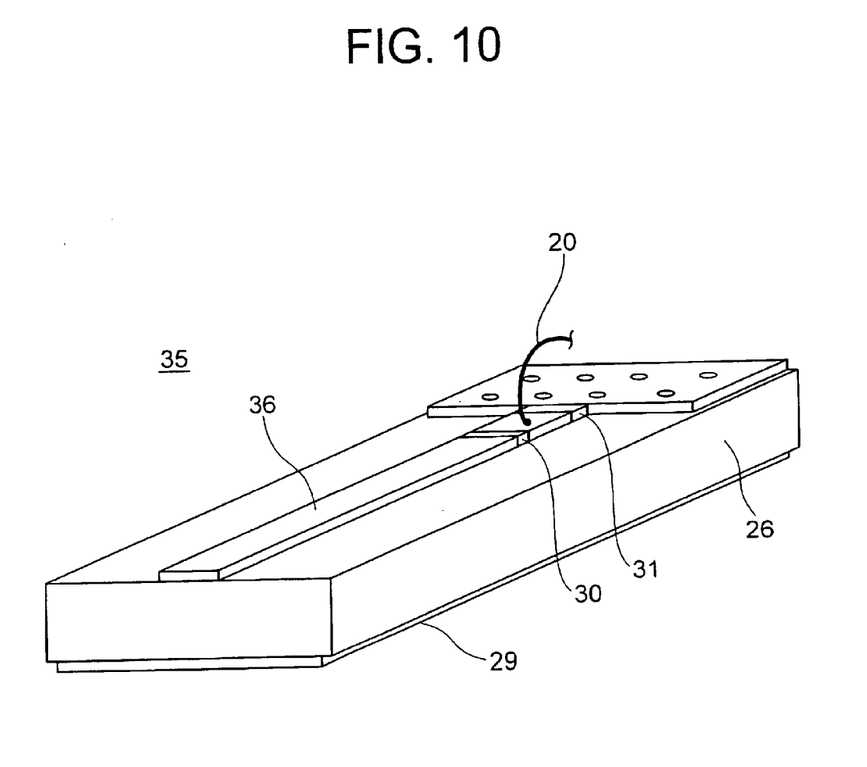
FIG. 10 is a schematic perspective view of a signal transmission line in an EA modulator according to a third embodiment of the present invention.
Figure 11A:
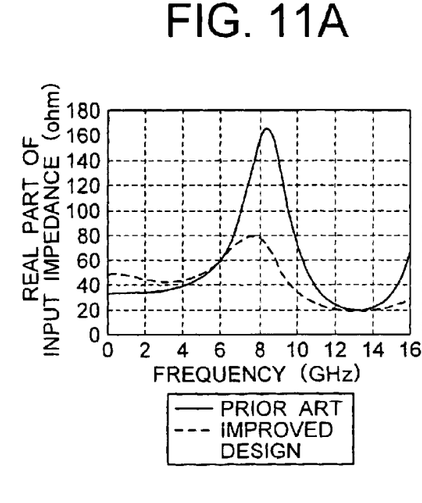
FIGS. 11A and 11B are graphs showing frequency dependencies of the real part and imaginary part, respectively, of the impedances of the EA modulators of the third embodiment and a comparative example representing a corresponding conventional EAML modulator.
Figure 11B:
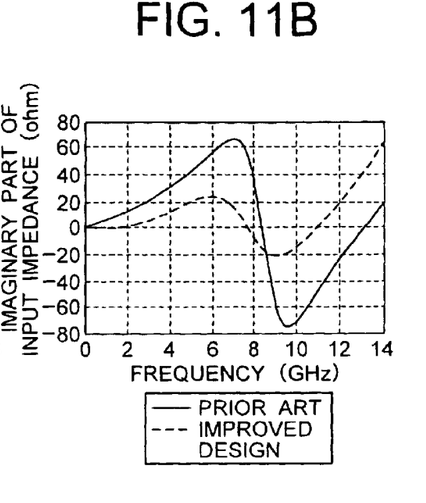
Figure 12A:
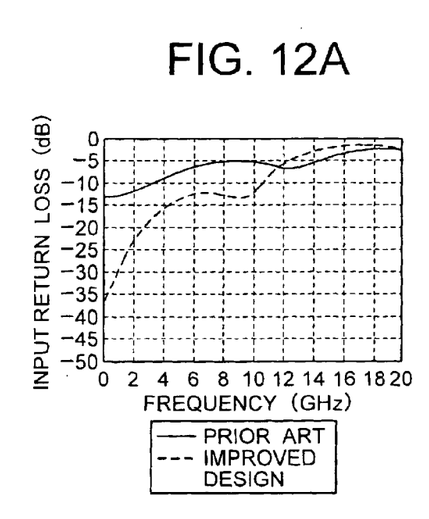
FIGS. 12A and 12B are graphs showing frequency dependencies of the input return loss and modulation response, respectively, of the EA modulators of the third embodiment and the corresponding comparative example.
Figure 12B:
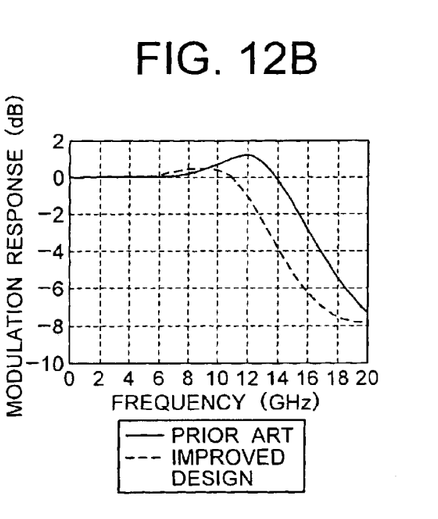

Referring to FIG. 10, there is shown a signal transmission line of an EA modulator according to a third embodiment of the present invention. The signal transmission line 35 is implemented by a micro-strip line including a signal line 36 and a ground plate 29 in the present embodiment. The micro-strip signal line 36 has a length of 3.2 mm, and a width of 0.46 mm, which is different from the width, 0.32 mm, of a conventional micros-trip line. The distance between the micro-strip signal line 36 and the bottom ground plate 29 is 0.3 mm in this example. The performances of the EA modulator of the present embodiment are compared with the performances of a corresponding comparative example by using simulation. The comparative example includes an ordinary micro-strip signal line having a characteristic impedance of 50 Ω and a termination resistance of 50 Ω, and has a circuit configuration similar to that shown in FIG. 4.

The results are illustrated in FIGS. 11A, 11B, 12A and 12B showing the real part of the input impedance, imaginary part of the input impedance, input return loss and modulation response, respectively, of the EAML modules of the present embodiment and the comparative example. The results obtained in the present embodiment are similar to those obtained in the first and second embodiments.

For finding the optimum values for the characteristic impedance of the signal line, series resistance, position thereof and the termination resistor, a variety of simulations are further conducted.

By analyzing the results shown in the above figures as well as other results, the optimum values for the series resistance, characteristic impedance, and positions of the series resistance are determined at 5 Ω, 41.8 Ω and 3.4 mm in the above embodiments.

For obtaining preferable ranges of the series resistance, termination resistance and the characteristic impedance as well as preferable circuit configurations, the following first through third simulations were conducted using the EA modulator of the third embodiment.

Figure 13:
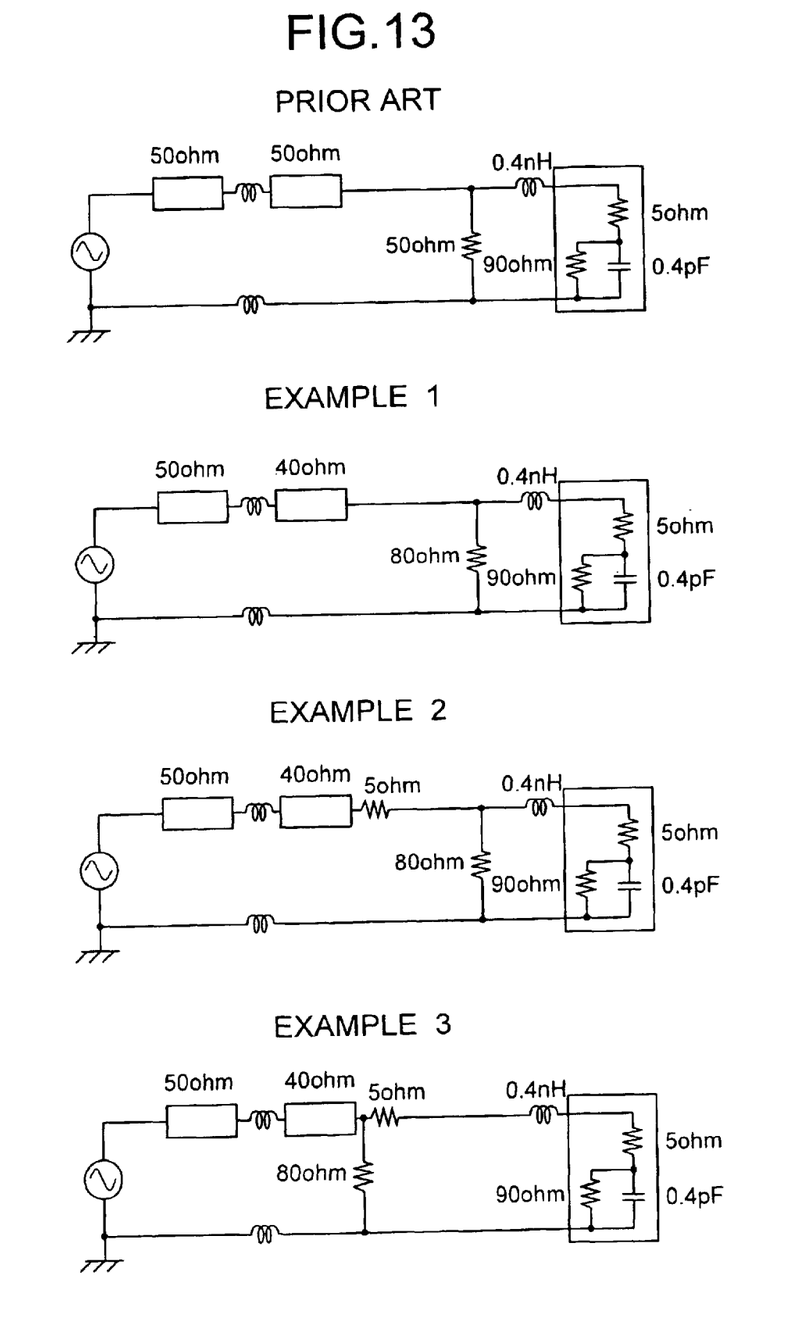
FIG. 13 shows a plurality of equivalent circuit diagrams of the EA modulators used for a first simulation.

FIG. 13 shows a variety of circuit configurations including prior art and examples 1 to 3 used in the first simulation. Prior art had characteristic impedance and termination resistance of 50 Ω and 50 Ω, respectively, and the micro-strip signal line was 0.28 mm wide and 3.2 mm long. The micro-strip line in each of examples 1 through 3 had a characteristic impedance of 40 Ω, and is associated with a termination resistance of 80 Ω. The micro-strip signal line of each of examples 1 and 2 was 0.425 mm wide and 3.2 mm long. Each of examples 2 and 3 had a series resistance of 5 Ω. The termination resistance of example 3 was connected between the node connecting the micro-strip line and the series resistance together and the ground line. The micro-strip line of example 3 was 0.425 mm wide and 3.2 mm long.

Figure 14A:
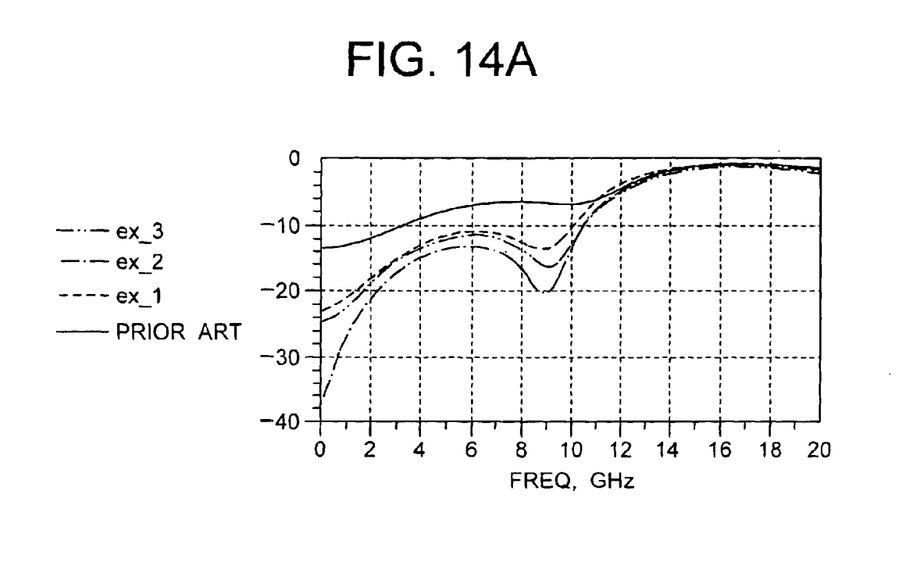
FIGS. 14A and 14B are graphs showing the frequency dependencies of the input return loss and the modulation response, respectively, of the EAML modules obtained by the first simulation.
Figure 14B:
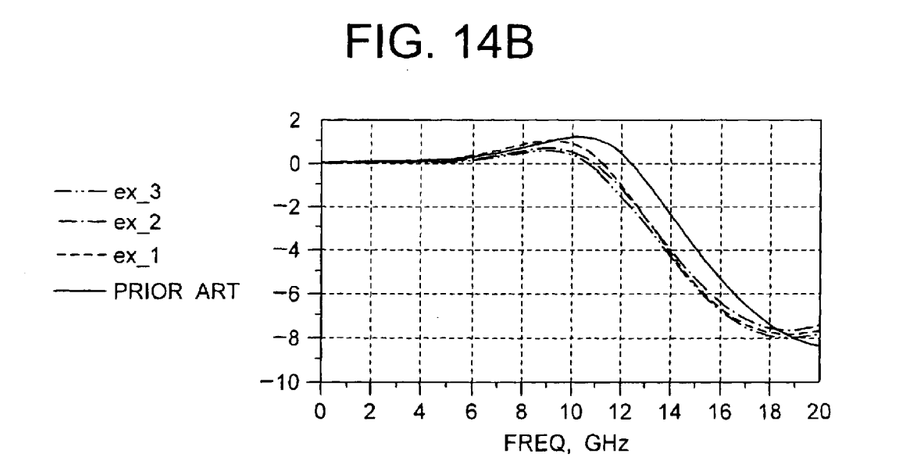

FIGS. 14A and 14B show the frequency dependencies of the input return loss and modulation response, respectively, of the prior art and examples 1 to 3 in the first simulation. As will be understood from these results, examples 1 to 3 have advantages in the input return loss in the frequency range between around 5 GHz and 11 GHz substantially without degradation in the modulation response at around 10 GHz. It was confirmed in this simulation that a series resistance of 5 Ω was preferable compared to the absence of the series resistance.

Figure 15:
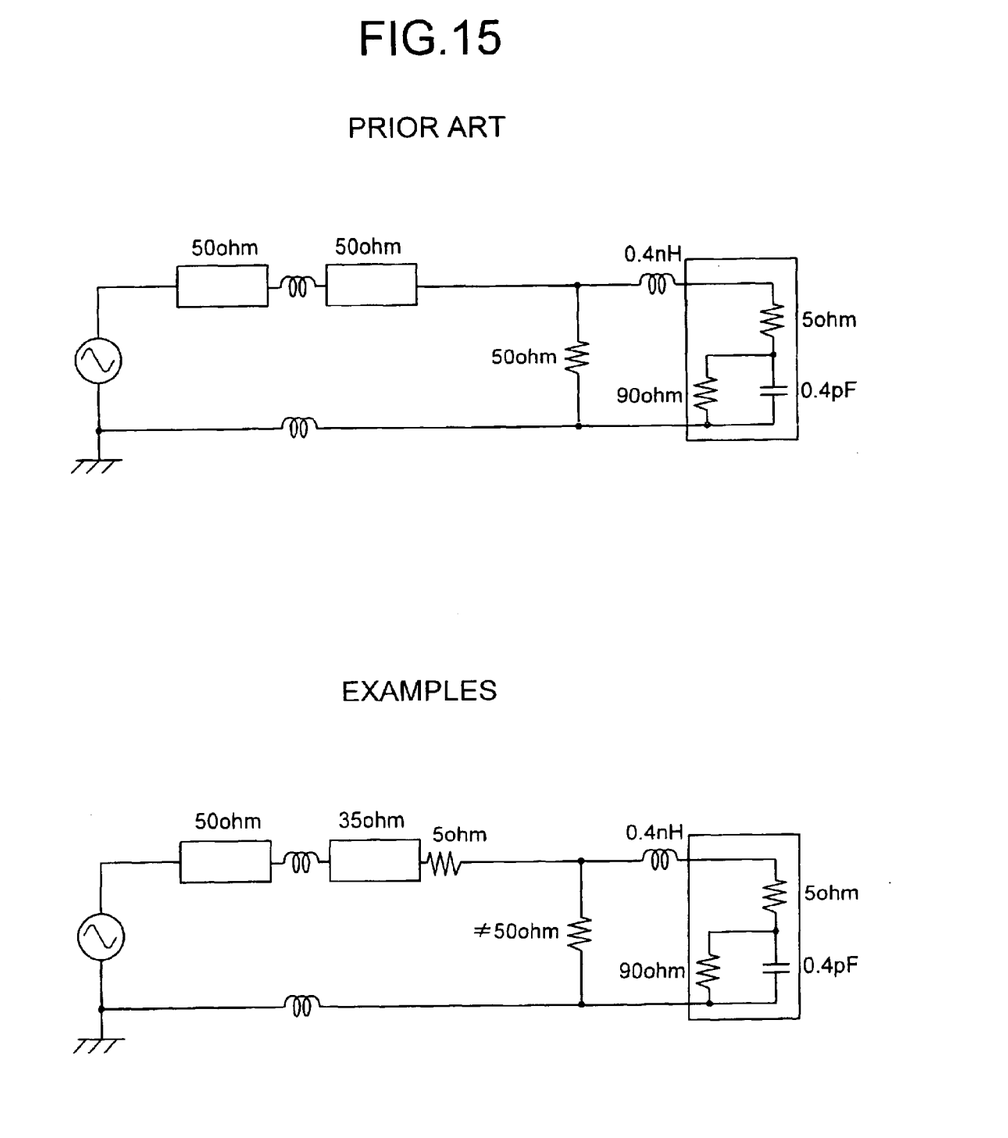
FIG. 15 shows a plurality of equivalent circuit diagrams of EA modulators used for a second simulation.

FIG. 15 shows a variety of circuit configurations including prior art and examples 1 to 7 in the second simulation using micro-strip lines. Prior art in FIG. 15 was similar to the prior art in the first simulation, examples 1 to 7 had termination resistances of 50, 60, 70, 80, 90, 100 and 150 ohm, respectively, with the series resistance and characteristic impedance being fixed at 5 Ω and 35 Ω, respectively. Each of examples 1 to 7 had a micro-strip signal line, which is 0.53 mm wide and 3.2 mm long.

Figure 16:
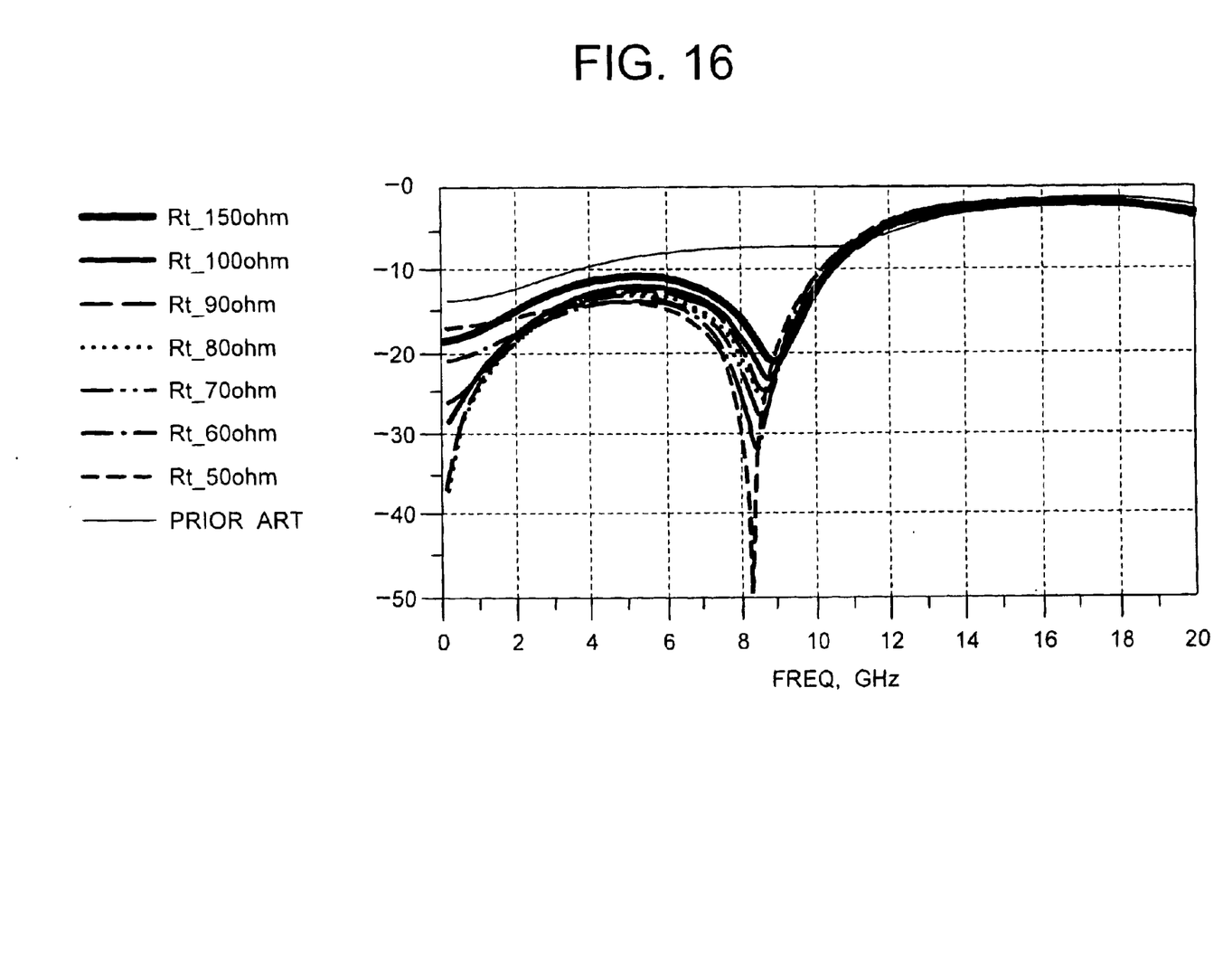
FIG. 16 is a graph showing the frequency dependencies of the input return loss and modulation response of the EA modulators obtained by the second simulation.

Referring to FIG. 16, each of examples 1 to 7 had a lower input return loss between around 5 GHz and 11 GHz compared to the prior art, although the input return loss slightly exceeded −10 dB required in the specifications at frequencies above around 10 GHz. It was shown in the second simulation that the input return loss could be lowered by lowering the characteristic impedance of the signal line down to 35 Ω compared to the prior art using a characteristic impedance of 50 Ω matched with the output impedance of the signal source, and that the termination resistance could be selected between 50 Ω and 150 Ω. It was confirmed in this simulation that a series resistance of 5 Ω was preferable compared to the absence of the series resistance.

Since the above embodiments are described only for examples, the present invention is not limited to the above embodiments and various modifications or alterations can be easily made therefrom by those skilled in the art without departing from the scope of the present invention. For example, although the present invention is described for the case of EA modulators in the EAML module, the present invention can be applied to any type of the optical modulators disposed alone or in an optical module.

What is claimed is:

1. A signal transmission line for transferring a modulating signal from a signal source having an output impedance of 50 Ω to an optical modulator, said signal transmission line comprising:

a signal line and at least one associated ground line, said signal line having a characteristic impedance of 35 to 47 Ω; and a termination resistor having a resistance of 50 to 150 Ω.

2. The signal transmission line according to claim 1, further comprising a series resistor having a resistance of 10 Ω or below.

3. The signal transmission line according to claim 1, wherein said signal line and said associated ground line form a micro-strip line.

4. The signal transmission line according to claim 3, wherein said signal line has a width larger than a design width of a signal line having a characteristic impedance of 50 Ω in another micro-strip line.

5. The signal transmission line according to claim 1, wherein said at least one associated ground line includes a pair of ground lines extending on a common plane with said signal line to sandwich therebetween said signal line, whereby said signal line and said ground lines form a coplanar waveguide.

6. The signal transmission line according to claim 5, wherein said at least one associated ground line further includes a ground plate opposing said signal line and said ground lines with an intervention of an insulator.

7. The signal transmission line according to claim 5, wherein a gap between said signal line and each of said ground lines is smaller than a design gap between a signal line and each of a pair of ground line in another coplanar waveguide.

8. A laser module comprising a laser diode, an optical modulator for modulating laser emitted by said laser diode, and a signal transmission line, said signal transmission line comprising:

a signal line and at least one associated ground line, said signal line having a characteristic impedance of 35 to 47 Ω;

a series resistor having a resistance of 10 Ω or below; and a termination resistor having a resistance of 50 to 150 Ω.

9. A signal transmission line for transferring a modulating signal from a signal source having an output impedance of R1 Ω to an optical modulator, said signal transmission line comprising:

a signal line and at least one associated ground line, said signal line having a characteristic impedance of 0.7R1 to 0.94R1; and a termination resistor having a resistance of R1 to 3R1.

* * * * *